United States Patent [19]

Uchida et al.

[11] Patent Number: 4,682,200

[45] Date of Patent: Jul. 21, 1987

[54] SEMICONDUCTOR MEMORY DEVICE WITH MATCHED EQUIVALENT SERIES RESISTANCES TO THE COMPLEMENTARY DATA LINES

[75] Inventors: Hideaki Uchida, Takasaki; Kinya Mitsumoto, Ohme; Yoshiaki Yazawa, Hitachi; Shinji Nakazato, Maebashi; Masanori Odaka, Kodaira, all of Japan

[73] Assignee: Hitachi, Ltd., Tokyo, Japan

[21] Appl. No.: 851,485

[22] Filed: Apr. 14, 1986

[30] Foreign Application Priority Data

Apr. 12, 1985 [JP] Japan .................................. 60-76551

[51] Int. Cl.[4] ............................................ H01L 27/02
[52] U.S. Cl. ...................................... 357/41; 357/45; 357/51; 357/59; 365/190; 365/202
[58] Field of Search ................. 365/190, 202; 357/41, 357/51, 23.6, 45, 59

[56] References Cited

U.S. PATENT DOCUMENTS 4,627,031 12/1986 Van Tran .......................... 365/190

Primary Examiner—Joseph E. Clawson, Jr.
Attorney, Agent, or Firm—Antonelli, Terry & Wands

[57] ABSTRACT

A semiconductor memory device wherein the equivalent series resistances that are interposed in series in the pairs of complementary data lines D, $\overline{D}$, are substantially the same as one another among the individual complementary data lines D, $\overline{D}$. The equivalent series resistance is comprised of pull-up MISFET's and column switching MISFET's that exist between the power source $V_{CC}$ and the sense circuit. Parity is maintained for the pull-up MISFET's ($Q_p$, $\overline{Q_P}$) and the column switching MISFET's ($Q_y$, $\overline{Q_y}$) that exist on the pairs of complementary data lines D, $\overline{D}$. To maintain this parity, the two MISFET's are formed to have the same shape. In addition, the arrangement of contacts to the transistors are set so that the directions in which the currents flow and lengths of current paths are also the same. In other words, contact portions between aluminum electrode and source and drain regions are formed at the same positions in the two MISFET's.

12 Claims, 18 Drawing Figures

SEMICONDUCTOR MEMORY DEVICE WITH MATCHED EQUIVALENT SERIES RESISTANCES TO THE COMPLEMENTARY DATA LINES

BACKGROUND OF THE INVENTION

The present invention relates to a semiconductor memory device, and particularly to a semiconductor memory device that can be suitably adapted to a static random access memory (hereinafter also referred to as static RAM or SRAM) which has a large capacity and which operates at high speeds.

A semiconductor memory device is typically comprised of memory cells for storing information, complementary data line pairs D, $\overline{D}$ connected to the memory cells, and word lines that are connected to the memory cells and that transmit control signals to control the electric connection with respect to the memory cells and to the complementary data line pairs D, $\overline{D}$.

In recent years, it has been urged to provide a semiconductor memory device which has a large capacity and which operates at high speeds. To meet such a demand, Hitachi, Ltd. has developed a static RAM which operates at a high speed while consuming reduced amounts of electric power by combining Bipolar and CMOS elements that will be described later. The present invention deals with technology which is adapted to producing an ultra-high-speed RAM as represented by the static RAM that operates at a further increased speed, while reliably preventing erroneous reading of data that may be caused by deviation in timings of the RAM and enabling the reliability to increase.

The present invention was accomplished by the inventors of the present invention as a result of development of such a static RAM.

SUMMARY OF THE INVENTION

The object of the present invention is to provide a static RAM having a large capacity which operates at a high speed and which features an increased reliability.

A representative example of the present invention will be roughly described below.

1. When the memory cells are not in operation, substantial equalization is provided for the equivalent series resistances that exist on the complementary data line pairs D, $\overline{D}$ between a power source potential $V_{CC}$ and a sense circuit SA.
2. The above requirement 1. can be accomplished in the following way.
   (a) Elements such as pull-up MISFET's $Q_{p1}$, $\overline{Q_{p1}}$ or column switching MISFET's $Q_{y1}$, $\overline{Q_{y1}}$ are interposed in series with the complementary data line pair D, $\overline{D}$ between the power source potential $V_{cc}$ and the sense circuit. Here, parities of the pull-up MISFET's $Q_{p1}$, $\overline{Q_{p1}}$ and column switching MISFET's $Q_{y1}$, $\overline{Q_{y1}}$ are brought into perfect agreement.
   (b) Speaking more concretely, the elements ($Q_{p1}$ and $\overline{Q_{p1}}$, $Q_{y1}$ and $\overline{Q_{y1}}$) of which the parities are to be brought into agreement, should be formed as described below.
   (i) Form the two elements in an equal size.
   (ii) An electrical current flows between source and drain. Here determine the directions in which the current flows to be the same and the lengths of current paths to be the same.

The following advantages are obtained from the above mentioned structure.

The same d-c bias currents flow through the complementary data line pair D, $\overline{D}$, and an equal base input bias current (or d-c voltage) is maintained for the bipolar differential sense circuit that is finally connected to the complementary data line pair D, $\overline{D}$.

As the memory cells are activated under this condition and the data stored are read out, the potential of the complementary data line pair D, $\overline{D}$ readily changes in response to the data. The potential difference is readily transmitted to the input of the differential sense amplifier, and "H" or "L" level is read out.

This makes it possible to accomplish both the high-speed operation and increased reliability.

BRIEF DESCRIPTION OF THE DRAWINGS

FIGS. 11(A) and 11(B) illustrate an embodiment of a structure for contacting the data lines to source regions of the column switching and pull-up MISFET's, wherein FIG. 11(A) is a section view along the line XI(A)–XI(A)' of FIG. 9, and FIG. 11(B) is a section view along the line XI(B)–XI(B)' of FIG. 9.

DESCRIPTION OF THE PREFERRED EMBODIMENT

First, described below is a Bi-CMOS SRAM developed by Hitachi, Ltd. as a preferred example of a device to which the present invention can be adapted.

Second, problems discovered by the inventors will be mentioned, and concrete structure of the embodiment will be explained.

(a) Outline of Bi-CMOS SRAM

Figure 1:
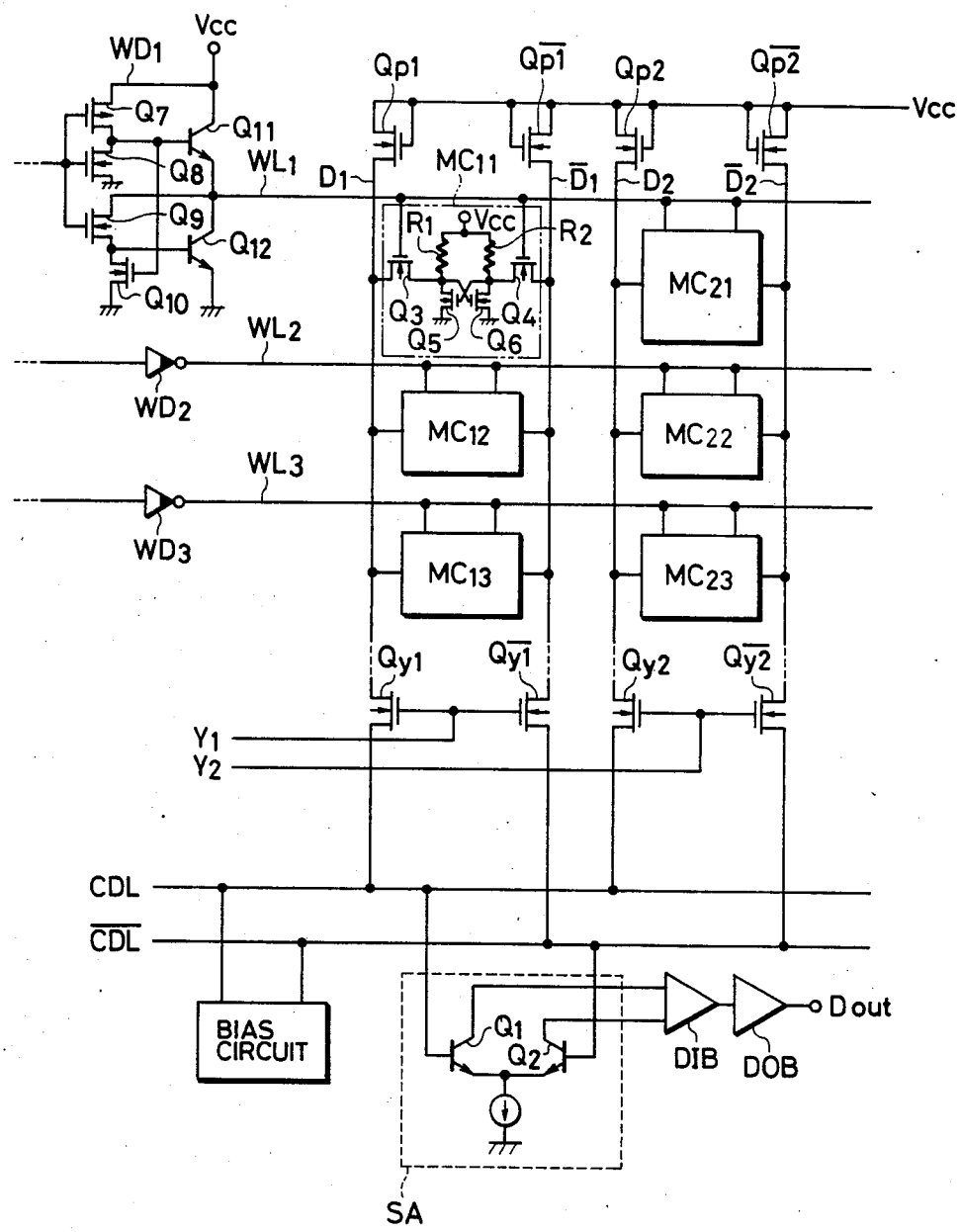
FIG. 1 is a diagram which schematically illustrates a Bi-CMOS SRAM which operates at an ultra-high speed while consuming reduced amounts of electric power, that was developed by Hitachi, Ltd. to which the present invention is adapted.

As shown in FIG. 1, the Bi-CMOS SRAM is comprised of memory cells MC11 to MC23 of the conventional flip-flop type, word lines WL1 to WL3, complementary data line pairs $D_1$, $\overline{D_1}$, $D_2$, $\overline{D_2}$, precharging MISFET's $Q_{p1}$, $\overline{Q_2}$, $Q_{p2}$, $\overline{Q_{p2}}$ and column switching MISFET's $Q_{y1}$, $\overline{Q_{y1}}$, $Q_{y2}$, $\overline{Q_{y2}}$. Word lines WL1 to WL3 are driven by inverters. As shown at the upper left portion of FIG. 1, the inverter employs bipolar elements for the output stage and employs MOS's for the input stage. The potential amplitude of the complementary data line pair D, $\overline{D}$ is 80 mV, and the potential amplitude of a common data line pair CDL, $\overline{CDL}$ is as small as 30 mV for the purpose of high-speed operation. To easily sense the small potential amplitude, there is formed a bipolar differential sense circuit SA. A logic circuit of inverters employing bipolar elements in the output stage is symbolized by blackening the output side.

(b) Problems discovered by the inventors

Figure 2A:
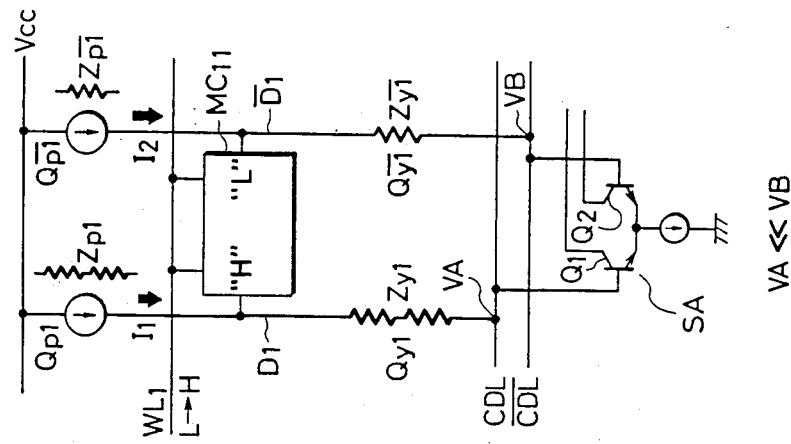
FIGS. 2(a), 2(b) and 2(c) are diagrams for illustrating problems that arise when the Bi-CMOS SRAM is operated at a very high speed.
Figure 2B:
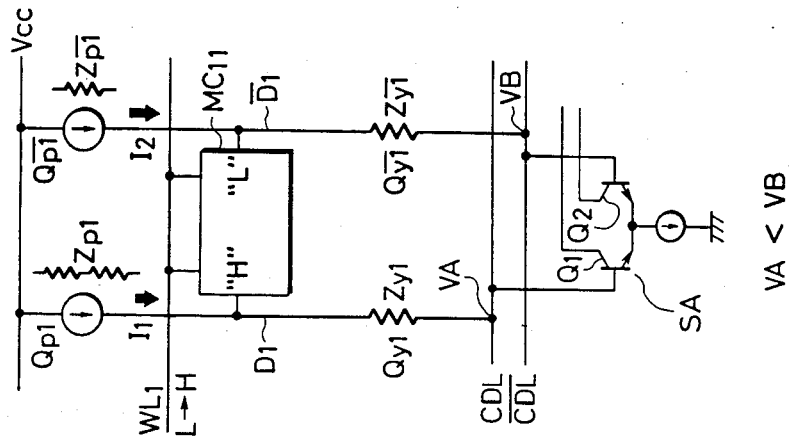
Figure 2C:
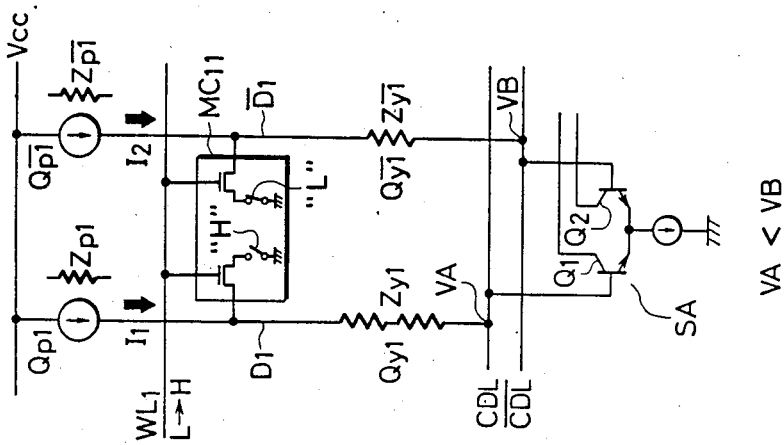

The problems are explained in FIGS. 2(a) to 2(c).

The problems were revealed for the first time when it was attempted to further increase the operation speed of the ultra-high speed semiconductor memory that has a potential amplitude of as small as 80 mV on the complementary data line pair D, $\overline{D}$ as described above, and an access time of 25 nsec.

There arises a problem regarding the equivalent series resistances (or impedance) between the complementary data line pair D, $\overline{D}$. This problem had not been known with the conventional low-speed RAM. As it was attempted to increase the operation speed, it was learned that a small series impedance of the complementary data line pair D, $\overline{D}$ affects the potential of the complementary data line pair D, $\overline{D}$ and, consequently, causes the access time to be delayed.

This fact will be mentioned below concretely.

FIGS. 2(a) to 2(c) are diagrams which are simplified representations of FIG. 1.

The pull-up MISFET's $Q_{p1}$, $\overline{Q_{p1}}$ can be regarded to constitute a constant-current source that supplies an electric current from the power source $V_{cc}$ to the complementary data line pair $D_1$, $\overline{D_1}$, and can further be regarded to be impedances $Z_{p1}$, $\overline{Z_{p1}}$ if consideration is given chiefly to their resistances while they are conductive. The column switching MISFET's $Q_{y1}$, $\overline{Q_{y1}}$ can also be regarded to be impedances $Z_{y1}$, $\overline{Z_{y1}}$.

The case will now be considered where the memory cell MC11 is in an inactive condition, and the word line WL1 is selected so that its level changes from the low level L to the high level H, and the data of the memory cell MC11 is read onto the complementary data lines $D_1$, $\overline{D_1}$.

(i) When $Z_{p1} = \overline{Z_{p1}}$ and $Z_{y1} > \overline{Z_{y1}}$ (see FIG. 2(a))

Since the impedances $Z_{p1}$, $\overline{Z_{p1}}$ are equal, the same currents $I_1$, $I_2$ flow as indicated by arrows in FIG. 2(a). However, since impedances $Z_{y1}$, $\overline{Z_{y1}}$ are not equal, the voltages drop differently; i.e., the voltage VA becomes smaller than the voltage VB, and offset develops in the precharging voltages for the complementary data line pair $D_1$, $\overline{D_1}$. When the word line WL1 is selected and the data of a phase opposite to the offset is read out from the memory cell MC11, an extended period of time is required for inverting the relation of voltages of the complementary data line pair $D_1$, $\overline{D_1}$ to the presence of offset, and an elongated access time is required.

(ii) When $Z_{p1} > \overline{Z_{p1}}$ and $Z_{y1} = \overline{Z_{y1}}$ FIG. 2(b))

Since the impedances $Z_{y1}$, $\overline{Z_{y1}}$ are the same, the voltage drops equally. However, since the impedances $Z_{p1}$, $\overline{Z_{p1}}$ are not the same, the current $I_1$ becomes smaller than the current $I_2$ as indicated by arrows. Due to the voltage drops across the impedances $Z_{p1}$, $\overline{Z_{p1}}$, therefore, the voltage VA becomes smaller than the voltage VB, and offset develops in the precharging voltages for the complementary data line pair $D_1$, $\overline{D_1}$. When the word line WL1 is selected and the data of a phase opposite to the offset is read out from the memory cell MC11, an extended period of time is required for inverting the voltages of the complementary data line pair $D_1$, $\overline{D_1}$, and an increased access time is required.

(iii) When $Z_{p1} > \overline{Z_{p1}}$ and $Z_{y1} > \overline{Z_{y1}}$ (see FIG. 2(c))

This is the worst case where both of the abovementioned phenomena i) and ii) have taken place. In FIG. 2(c), the relation of voltages VA, VB becomes VA < VB, and the precharging voltages for the complementary data line pair $D_1$, $\overline{D_1}$ develop quite a large offset. Therefore, a significantly longer access time is required making it difficult to accomplish the high-speed operation.

With the above-mentioned inconvenience taking place, if the timing from when the word line WL1 is selected to when the constant-current source for the sense amplifier SA is driven is set to a conventional setpoint, there develops the case where voltages of the complementary data line pair $D_1$, $\overline{D_1}$ are not inverted within the above period of time. Therefore, the data is erroneously read and the reliability is lost. If the timing is extended to assure sufficient reliability, then the ultra-high speed RAM operates at low speeds.

Particularly regarding the problem discovered by the inventors, it should be noted that in the Bi-CMOS SRAM, the potential amplitude of the lines CDL, $\overline{CDL}$ is about 30 mV. Therefore, from the inventors' studies, if the variation between the series resistance in the respective lines D and $\overline{D}$ is 600Ω or greater, data is erroneously read. This is significantly different than in the case of a conventional CMOS SRAM. More specifically, in a conventional CMOS SRAM, the potential amplitude of the lines CDL and $\overline{CDL}$ is about 300 mV. Therefore, the variation in the series resistance between the lines D and $\overline{D}$ can be as high as 6 KΩ or greater without causing data to be erroneously read. Thus, the inventors have found that a significant difference exists between the case of a conventional CMOS SRAM and a Bi-CMOS SRAM regarding the requirement for minimizing resistance variation between the lines D and $\overline{D}$.

(c) Features of the Invention

Figure 3:
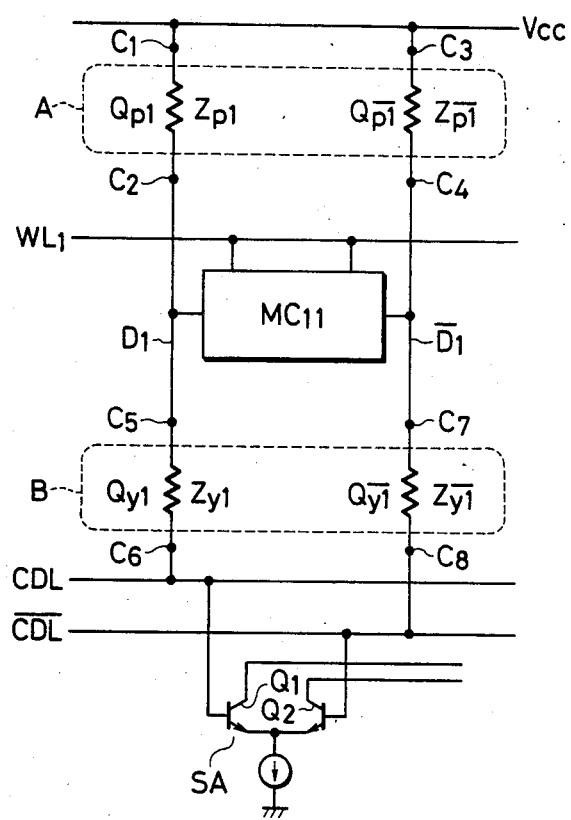
FIG. 3 is a diagram which explains the principle of the present invention, and wherein a complementary data line pair $D_1$, $\overline{D_1}$ have the same series resistance.

Most ideally as shown in FIG. 3, equivalent series resistances interposed in series across the power source $V_{CC}$ and the sense circuit SA, should be nearly equal to each other between the complementary data line pair $D_1$ and $\overline{D_1}$. For this purpose, the greatest feature of the present invention is to maintain, as much as possible, the parity between the pull-up MISFET's $Q_{p1}$ and $\overline{Q_{p1}}$ surrounded by a dotted line A as well as the parity between the column switching MISFET's $Q_{y1}$ and $\overline{Q_{y1}}$ surrounded by a dotted line B. Although the invention is not limited to this, preferred values for $Z_{p1}$ and $\overline{Z_{p1}}$ are about 10 KΩ while preferred values for $Z_{y1}$ and $\overline{Z_{y1}}$ are about 8 KΩ (noting that variations between the series resistances should preferably be significantly less than 600Ω, as noted above, to prevent erroneous data readout).

Figure 4A:
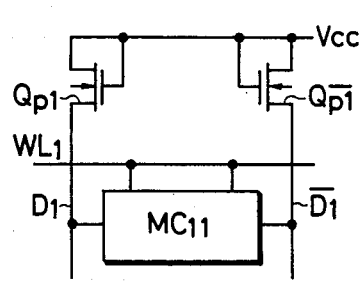
FIGS. 4(a), 4(b) and 4(c) are diagrams which concretely illustrate the structure of the present invention, wherein the elements are formed in the same shape, and the direction in which the current flows and the length l of current path are determined to be the same as shown in FIGS. 4(b) and 4(c) such that the pull-up MISFET's $Q_{p1}$, $\overline{Q_{p1}}$ in the circuit of FIG. 4(a) will exhibit the same characteristics.
Figure 4B:
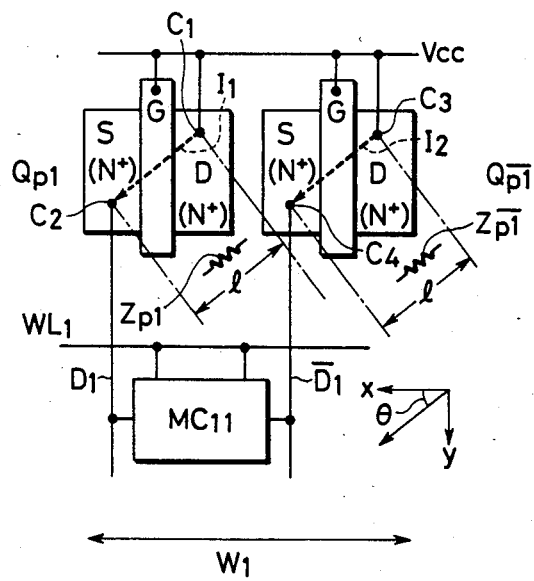
Figure 4C:
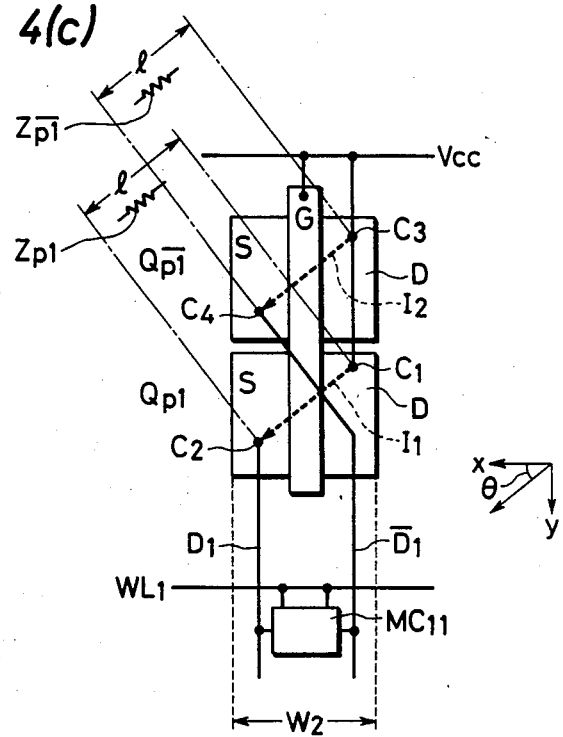

A concrete example is shown in FIGS. 4(a) to 4(c).

FIG. 4(a) is a circuit diagram to illustrate the pull-up MISFET's $Q_{p1}$ and $\overline{Q_{p1}}$ which constitute an object to which the present invention is adapted.

FIGS. 4(b) and 4(c) are plan views showing the layout of when the pull-up MISFET's $Q_{p1}$, $\overline{Q_{p1}}$ of FIG. 4(a) are concretely constituted in the form of an integrated circuit device. Each of the pull-up MISFET's $Q_{p1}$, $\overline{Q_{p1}}$ can be of a polycrystalline silicon gate G, and n+-type source S and drain D formed by implanting arsenic ions with the gate G as a mask, and has the same size.

In the drawings, dotted arrows indicate the directions of currents $I_1$, $I_2$. The following facts will be comprehended from the drawings:

(1) The currents $I_1$, $I_2$ flow in the same direction defining an angle which is the same as the angle θ relative to the X- and Y-directions. The angle θ can be arbitrarily selected but does not constitute an essential matter of the present invention. The angle θ varies depending upon the size of MISFET's $Q_{p1}$, $\overline{Q_{p1}}$, and is controlled by the location of source and drain contacts $C_1$ to $C_4$.

(2) The length of current paths in each of the currents $I_1$, $I_2$ is the same as an equal length l. Hence, the length l represents an equivalent resistance. This length is also controlled by the location of the source and drain contacts.

(3) In other words, the connection points or contact positions C1 to C4 between the aluminum electrode and the n+-type source S and drain D, establish the same relationship for both of the MISFET's $Q_{p1}$ and $\overline{Q_{p1}}$. The contact positions C1 to C4 represent the positions shown in FIG. 3. Although the invention is not limited to this, it is noted that the contact area size of the contacts $C_1$ and $C_2$ can be about 2 μm×2 μm while the source and drain regions can each be about 5 μm in width and 20 μm in length.

The difference between FIG. 4(b) and FIG. 4(c) is represented by a difference in the layout widths $W_1$, $W_2$. If the MISFET's $Q_{p1}$, $\overline{Q_{p1}}$ are vertically arranged in the direction in which the complementary data line pair $D_1$, $\overline{D_1}$ stretch as shown in FIG. 4(c), the layout width $W_2$ can be reduced to be almost equal to the layout width of memory cell MC11. This is advantageous from the standpoint of forming the semiconductor memory in a highly integrated form having a large capacity. Although the invention is not limited to this, typically $W_1$ in FIG. 4(b) is about 25 μm while $W_2$ in FIG. 4(c) is about 13 μm.

The above-mentioned structure can also be adapted to the column switching MISFET's $Q_{y1}$, $\overline{Q_{y1}}$ shown in FIG. 3, so that the MISFET's $Q_{y1}$, $\overline{Q_{y1}}$ will exhibit equal characteristics.

According to the present invention, furthermore, equivalent resistances of pull-up MISFET's $Q_{p1}$, $\overline{Q_{p1}}$ and column switching MISFET's $Q_{y1}$, $\overline{Q_{y1}}$ can be reduced.

Figures 5A, 5B:
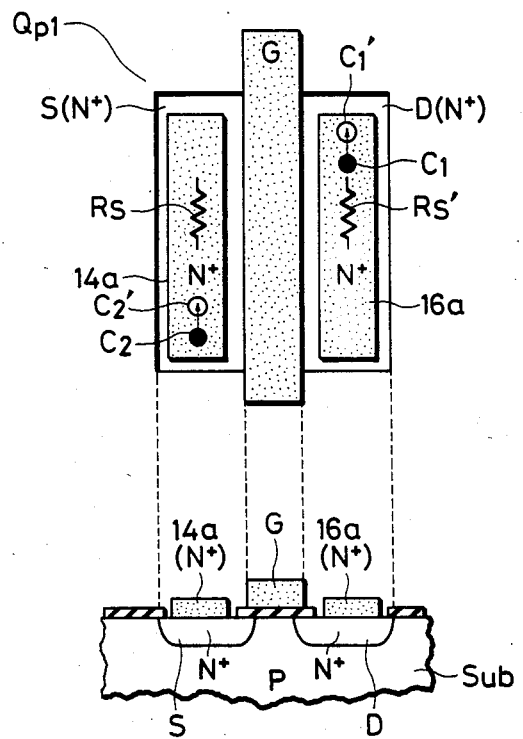
FIGS. 5(a) and 5(b) illustrate a modified example of the present invention.

FIGS. 5(a) and 5(b) show an example thereof with reference to MISFET $Q_{p1}$. FIG. 5(a) is a section view of FIG. 5(a) with the MISFET $Q_{p1}$. A limitation is imposed on the arrangement of contact positions $C_1$, $C_2$ at which the complementary data line pair $D_1$, $\overline{D_1}$ are connected to the n+-type source S and drain D. When the contact positions $C_1$, $C_2$ are remote from each other as shown in FIGS. 4(b) and 4(c), parasitic resistances Rs, Rs' appear in the semiconductor regions of n+-type source S and drain D regions as shown in FIG. 5(a). In order to reduce the parasitic resistances, n+-type polycrystalline silicon layers 14a, 16a of a high concentration used as wirings in the memory cell are directly connected to the n+-type source S and drain D. Therefore, the parasitic resistances Rs, Rs' diminish, and equivalent resistance of the MISFET $Q_{p1}$ can be reduced.

Even in case the contact positions are deviated due to variance in the manufacturing process as indicated by $C_1 \rightarrow C_1'$ and $C_2 \rightarrow C_2'$ in FIG. 5(a), the variance of the equivalent resistances of the MISFET $Q_{p1}$ can be reduced.

Owing to the above-mentioned structure, the equivalent resistance in a MISFET is reduced and is uniformalized. Accordingly, series resistance of each of the complementary data line pair $D_1$, $\overline{D_1}$ is reduced and is uniformalized.

Figure 6A:
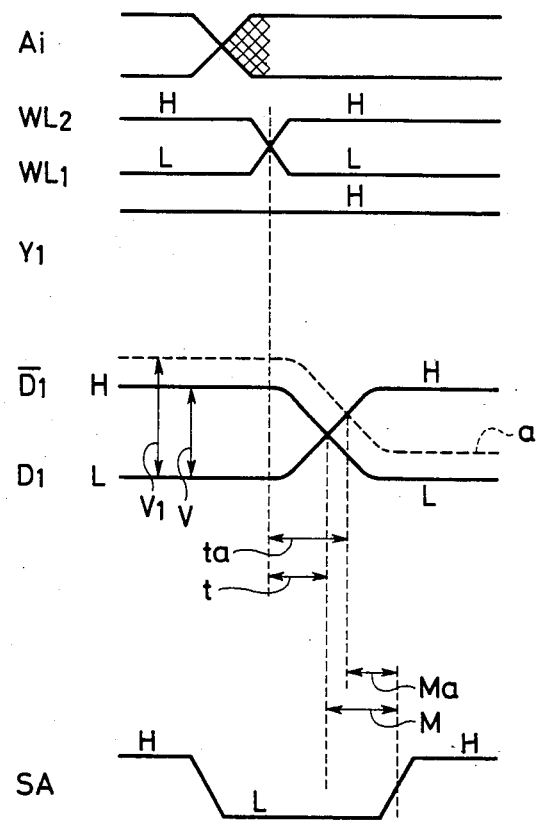
FIGS. 6(a) and 6(b) are timing charts for explaining the effects of the present invention.

FIG. 6(a) is a diagram which explains the effects of the present invention. Referring back to FIG. 1, it is presumed that the memory cell MC11 having data of an opposite phase is selected following the memory cell MC12. When there is no offset in the precharging voltages for the complementary data line pair $D_1$, $\overline{D_1}$, the voltage amplitudes have a predetermined value V as indicated by solid lines. An operation margin M from the moment when the voltage amplitude between the lines D and $\overline{D}$ is inverted to the moment when the constant-current source of the sense amplifier is selected, is set to a predetermined value. Further, a time t from the moment when the word line $WL_1$ is selected to the moment when the voltage amplitude between the lines $D_1$ and $\overline{D_1}$ is inverted, is also set to a predetermined value. The data is not read erroneously.

As the offset generates, the voltage amplitude changes as indicated by a dotted line a, whereby the time t is lengthened as denoted by $t_a$, and the operation margin M decreases as denoted by Ma. When the offset is large, the time $t_a$ is further lengthened as shown in FIG. 6 (a), and the sense amplifier is selected during the time $t_a$. Therefore, the data is read erroneously, and the reliability decreases.

Figure 6B:
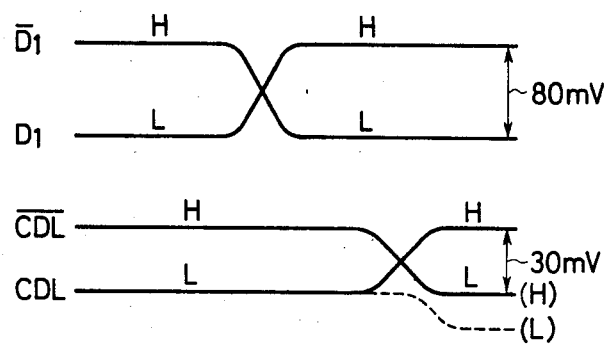

FIG. 6(b) shows the decrease of reliability of the case of FIG. 2(a). The voltage amplitudes of common data line pair CDL, $\overline{CDL}$ are decreased to as small as 30 mV to read the data at high speeds. If the impedance $Z_{y1}$ is large, however, the potential does not rise on the CDL side, whereby the line CDL assumes the high level and the line $\overline{CDL}$ assumes the low level as shown. Therefore, the data is erroneously read and the reliability decreases. This is a serious problem which decreases the production yield of semiconductor memories.

(d) Embodiment

Figure 7:
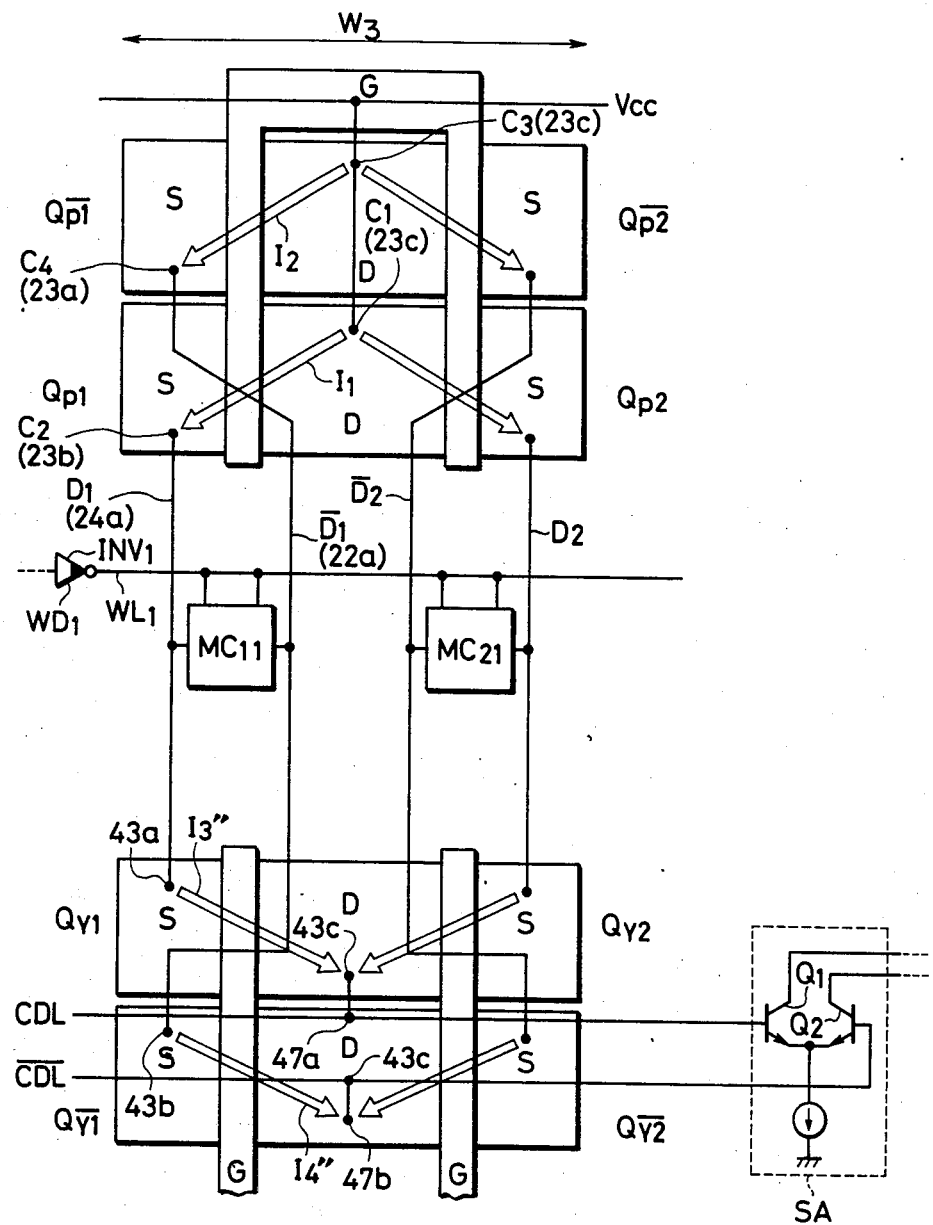
FIG. 7 is a plan view of pull-up MISFET's $Q_{p1}$, $\overline{Q_{p1}}$, $Q_{p2}$, $\overline{Q_{p2}}$ and column switching MISFET's $Q_{y1}$, $\overline{Q_{y1}}$, $Q_{y2}$, $\overline{Q_{y2}}$ when the present invention is practically adapted to the Bi-CMOS SRAM.

FIG. 7 is a schematic diagram which more concretely illustrates a semiconductor memory to which the method of arrangement of FIG. 4(c) is adapted. The method of arrangement is adapted to pull-up MISFET's $Q_{p1}$, $\overline{Q_{p1}}$, $Q_{p2}$, $\overline{Q_{p2}}$, and to switching MISFET's $Q_{y1}$, $\overline{Q_{y1}}$, $Q_{y2}$, $\overline{Q_{y2}}$ that are shown in FIG. 1.

Drains D of MISFET's $Q_{p1}$, $Q_{p2}$ and drains D of MISFET's $\overline{Q_{p1}}$, $\overline{Q_{p2}}$, drains D of MISFET's $Q_{y1}$, $Q_{y2}$, and drains D of MISFET's $\overline{Q_{y1}}$, $\overline{Q_{y2}}$, are laid out so as to be commonly used. Therefore, the layout width $W_3$ (e.g. about 26 μm) of these elements is close to the width of the memory cells MC11, MC12, lending the device well for being highly integrated.

The switching MISFET's $Q_{y1}$, $\overline{Q_{y1}}$ have the current paths $I_3''$, $I_4''$ that are oriented in the same direction, and exhibit the same characteristics.

Figure 9:
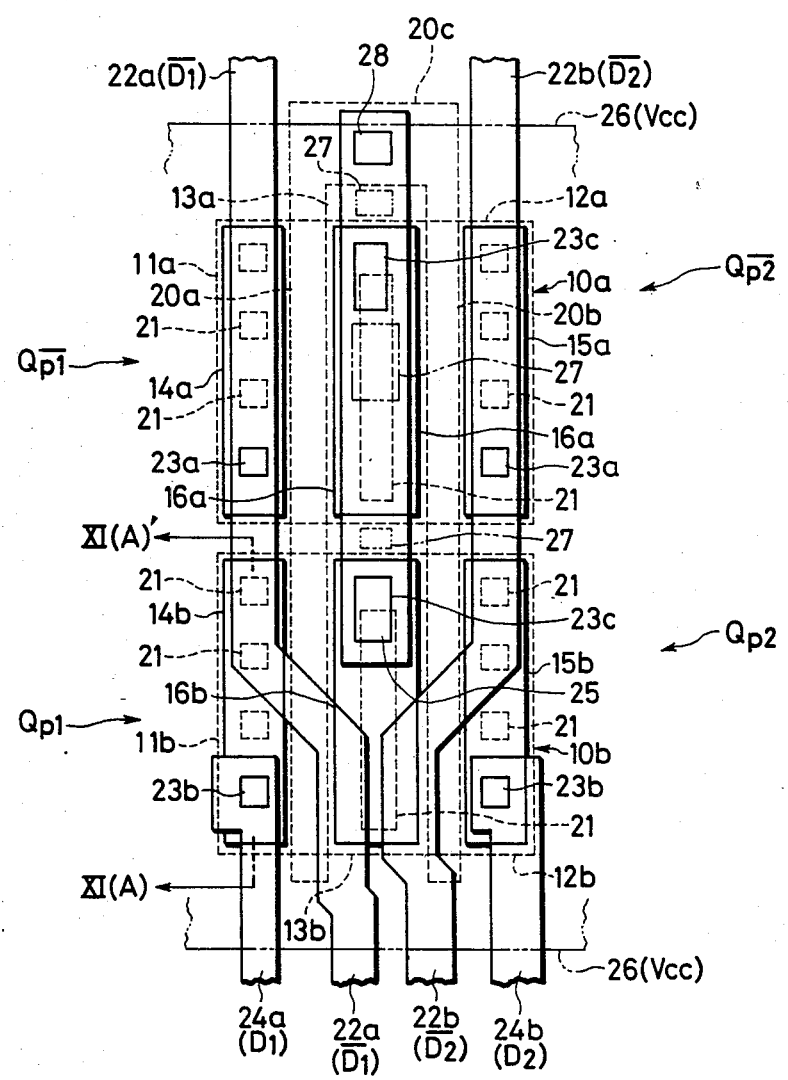
FIG. 9 is a plan view illustrating an embodiment of the layout of pull-up MISFET's $Q_p$, $\overline{Q_p}$ two pairs of complementary data lines.
Figure 10:
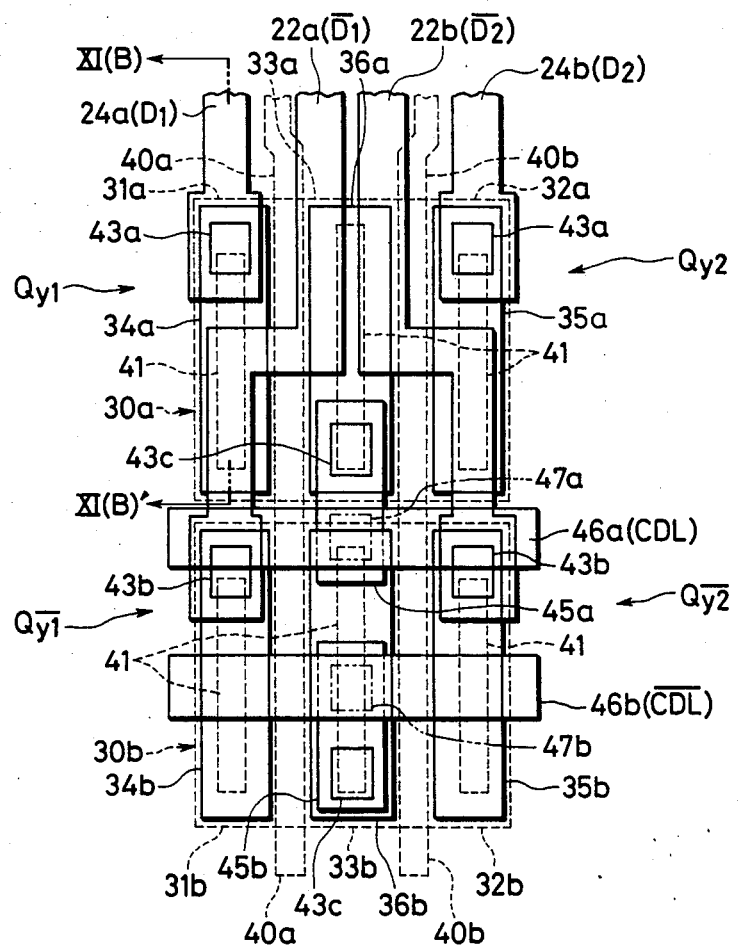
FIG. 10 is a plan view illustrating an embodiment of the layout of column switching MISFET's $Q_y$, $\overline{Q_y}$.

FIGS. 9 and 10 illustrate practical layout of pull-up MISFET's $Q_{p1}$, $\overline{Q_{p1}}$, $Q_{p2}$, $\overline{Q_{p2}}$, and switching MISFET's $Q_{y1}$, $\overline{Q_{y1}}$, $Q_{y2}$, $\overline{Q_{y2}}$ FIG. 7.

The invention will be described below in further detail, and the practical layout will be mentioned below.

According to the present invention, the drain region and the source region of the two MISFET's, i.e., of a first transistor $Q_{y1}$ ($\overline{Q_{y1}}$) and of a second transistor $\overline{Q_{y1}}$ ($Q_{y1}$) which are column switching MISFET's, are formed in the same shape, so that they will exhibit the same drain distribution resistance and source distribution resistance. Namely, the two MISFET's exhibit the same characteristics, so that the offset voltage of the complementary data line pair can be eliminated. The elements $Q_{y1}$ and $\overline{Q_{y1}}$ are arranged at symmetrical positions relative to a line. To accomplish a high degree of integration, however, the elements should be vertically arranged at symmetrical positions relative to a line in a direction in which the complementary data lines stretch. The same relations are also adapted to the source region and drain region of the third transistor $Q_{p1}$ ($\overline{Q_{p1}}$) and the fourth transistor $\overline{Q_{p1}}$ ($Q_{p1}$) which are pull-up MISFET's, and to the positions of the transistors $Q_{p1}$, $\overline{Q_{p1}}$, so that they will exhibit the same characteristics.

As for the contact positions relative to low distribution resistance wirings ($D_1$, $\overline{D_1}$, etc.) connected to sources or drains of the transistors $Q_{y1}$, $\overline{Q_{y1}}$ or $Q_{p1}$, $\overline{Q_{p1}}$, the contact holes relative to the source and drain are formed at the same positions in the transistors $Q_{y1}$, $\overline{Q_{y1}}$ to decrease variance in the distribution resistance caused by deviated contact, such that the transistors will exhibit the same characteristics.

Moreover, in order to decrease the contact resistance and to prevent variance in the characteristics, the wirings of the transistors $Q_{y1}$, $\overline{Q_{y1}}$ and $Q_{p1}$, $\overline{Q_{p1}}$ are connected to the source and drain regions via polycrystalline silicon layers of a small resistance.

To decrease variance in the gate size of the transistors $Q_{y1}$, $\overline{Q_{y1}}$ and $Q_{p1}$, $\overline{Q_{p1}}$ caused by unstable factors in the manufacturing process, furthermore, the gates of the MISFET's are so formed as to have a length longer than a minimum processable size.

Relying upon the above-mentioned variety of contrivances, the most important factor, i.e., parity, is maintained between $Q_{y1}$ and $\overline{Q_{y1}}$ and between $Q_{p1}$ and $\overline{Q_{p1}}$, so that the MISFET's exhibit the same characteristics.

Figure 8:
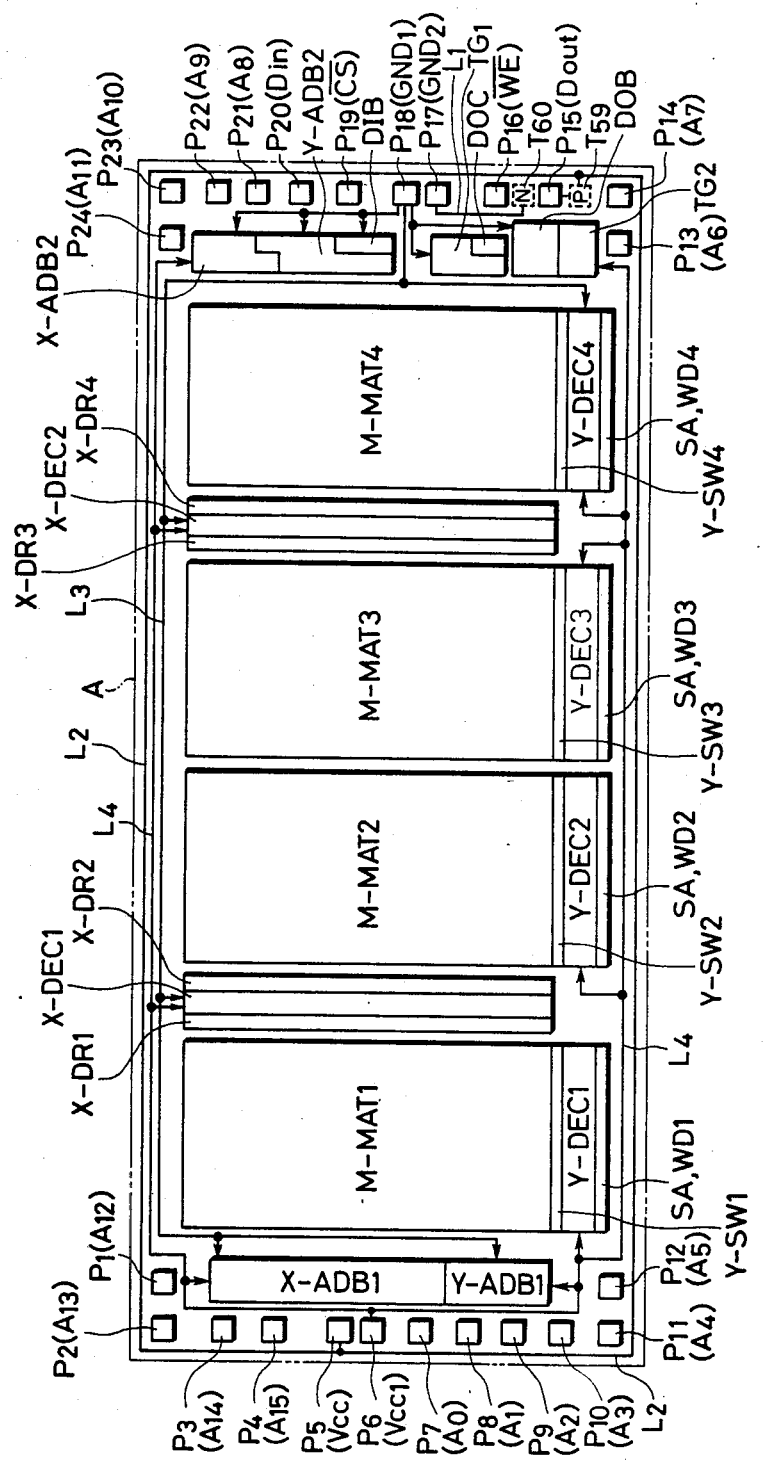
FIG. 8 is a diagram which shows the layout of the whole chip of Bi-CMOS static RAM to which the present invention is adapted.

FIG. 8 shows an embodiment of layout of the whole chip of the case when the present invention is adapted to the Bi-CMOS static RAM that is constituted by bipolar transistors and complementary MISFET's and that was developed by the inventors of the present invention.

In FIG. 8, the circuit blocks surrounded by a chain line A are formed on a semiconductor chip such as a single crystalline silicon substrate relying upon the semi-conductor integrated circuit technology.

Though there is no particular limitation, the static RAM of this embodiment has a memory array which is divided into four memory mats M-MAT1 to M-MAT4, each containing memory cells of the type of high-resistance load arranged in the form of a matrix consisting, for example, of 128 rows × 128 columns.

Between the memory mats M-MAT1 and M-MAT2 is provided an X-decoder X-DEC1 that has word line select/drive circuits X-DR1 and X-DR2 on both sides thereof, and between the memory mats M-MAT3 and M-MAT4 is provided an X-decoder X-DEC2 that has word line select/drive circuits X-DR3 and X-DR4 on both sides thereof.

On one side (lower side in FIG. 8) of the memory mats M-MAT1 to M-MAT4, there are provided column switch groups Y-SW1 to Y-SW4 for connecting data line pairs arranged in each of the mats to the common data line pairs, Y-decoders Y-DEC1 to Y-DEC4 for selectively turning on a pair of column switches that correspond to address signals $A_7$ to $A_{15}$ in these column switch groups, and sense amplifiers as well as write driver columns SA, WD1 to SA, WD4.

On both sides of the memory mats M-MAT1 to M-MAT4, furthermore, there are arranged X-address buffer circuits X-ADB1, X-ADB2 and Y-address buffer circuits Y-ADB1, Y-ADB2 that form internal address signals for the X-decoders X-DEC1, X-DEC2 and Y-decoders Y-DEC1 to Y-DEC4 responsive to address signals $A_0$ to $A_{15}$ supplied from an external circuit. Though not specifically limited, the address buffer circuits X-ADB1 to Y-ADB2 have a pre-decoding function, respectively.

Under the Y-address buffer circuit Y-ADB2, there are arranged an input buffer circuit DIB, an output buffer circuit DOB, and timing generator circuits TG1, TG2 that form suitable internal control signals responsive to control signals CS and WE supplied from an external circuit.

In this embodiment, as shown in FIG. 8, pads $P_1$ to $P_{24}$ are arranged along the right and left sides of the semiconductor chip A according to a predetermined order being corresponded to the arrangement of pins, the pads $P_1$ to $P_{24}$ being served with address signals $A_0$ to $A_{15}$, control signals $\overline{CS}$, $\overline{WE}$, the power source voltage $V_{CC}$ of the circuit, and ground potential GND. In this embodiment, furthermore, the group of pads $P_1$ to $P_{24}$ contains two pads that are corresponded to the power source voltage $V_{CC}$ and another two pads corresponded to the ground potential GND. Power supply voltages $V_{CC1}$, $V_{CC2}$ and ground potentials $GND_1$, $GND_2$ applied to these pads are then supplied into the chip.

Though there is no particular limitation, a p-channel MISFET $T_{59}$ and an n-channel MISFET $T_{60}$ of a relatively large size which constitute a final pushpull output stage of the data output buffer circuit DOB, are arranged on both sides (upper and lower sides in FIG. 8) of the pad $P_{15}$ among the pads $P_1$ to $P_{24}$. The ground potential $GND_2$ applied to the pad $P_{17}$ is supplied to only the MISFET $T_{60}$ through a wiring $L_1$, and the power source voltage $V_{CC2}$ applied to the pad $P_5$ is supplied only to the MISFET $T_{59}$ through a power source line $L_2$ that is formed along the edge on the outside of the pads $P_1$ to $P_{24}$ that are formed along the periphery of the semiconductor chip A.

The power source voltage $V_{CC1}$ and the ground potential $GND_1$ applied to the pads $P_6$ and $P_{18}$ are supplied to the address buffers X-ADB1, X-ADB2, Y-ADB1, Y-ADB2 and decoders X-DEC1, X-DEC2, Y-DEC1 to Y-DEC4, except the final stage (MISFET's $T_{59}$ and $T_{60}$) of the output buffer circuit DOB, through power source lines $L_3$, $L_4$ that are formed inside the pads $P_1$ to $P_{24}$ at the edge of the chip and inside the power source line $L_2$.

FIG. 9 shows an embodiment of layout of pull-up MISFET's $Q_{P1}, \overline{Q_{p1}}, Q_{p2}, \overline{Q_{p2}}$ on two pairs of complementary data lines in the memory aray.

On the semiconductor substrate, two rectangular active regions 10a, 10b are vertically formed along the direction of data lines, the two rectangular active regions 10a, 10b being isolated by a selectively oxidized film. On the active regions 10a, 10b are formed a pair of parallel gate electrode layers 20a, 20b that are composed of polycrystalline silicon layers via a gate insulating film (not shown). N-type impurities are introduced into the main surface of the semiconductor substrate with the gate electrode layers 20a, 20b as masks, whereby there are formed source regions 11a, 12a and a common drain region 13a of pull-up MISFET's $\overline{Q_{p1}}$ and $\overline{Q_{p2}}$ on the side of data lines $\overline{D_1}, \overline{D_2}$ the active region 10a. Similarly, there are formed source regions 11b, 12b and a common drain region 13b of pull-up MISFET's $Q_{p1}$ and $Q_{p2}$ on the side of data lines $D_1, D_2$ in the active region 10b.

On the source and drain regions 11a to 13a, and 11b to 13b, there are formed, via an insulating film, polycrystalline silicon layers 14a 15a, 16a and 14b, 15b, 106b which work as buffer layers and which are contacted to the source and drain regions 11a to 13a and 11b to 13b via a plurality of contact holes or a continuous oblong contact hole 21 that run in the direction of data lines, the contact holes being formed in the lower insulating film. The polycrystalline silicon layers 14a to 16a and 14b to 16b are formed simultaneously with the polycrystalline silicon layer which constitutes high-resistance elements in the memory cells of the type of high-resistance load, that are not shown. By introducing n-type impurities such as phosphorus ions into portions other than those portions that serve as resistors, the electric resistance of the polycrystalline silicon layers can be lowered (5Ω ohms/□). Ends (upper ends in FIG. 9) of the polycrystalline silicon gate electrode layers 20a, 20b, are connected to each other through a connection portion 20c. For instance, the diffusion resistance of the source and drain regions is 500 ohms/□.

First aluminum layers 22a, 22b that will serve as data lines $\overline{D_1}, \overline{D_2}$ are formed, via an insulating film, on the drain regions 11a, 12a located on the outside of the pair of gate electrode layers 20a, 20b. The aluminum layers 22a, 22b are contacted to the polycrystalline silicon layers 14a, 15a via contact hole 23a that is formed in the underlying insulating film, whereby the data lines $\overline{D_1}, \overline{D_2}$ are connected to the source regions of MISFET's $\overline{Q_{p1}}, Q_{p2}$ via polycrystalline silicon layers 14a, 15a.

The aluminum layers 22a, 22b that serve as data lines $\overline{D_1}, \overline{D_2}$ cross the polycrystalline silicon gate electrode layers 20a, 20b at the center of the active region 10b on the lower side of the drawing, and downwardly stretch straight to cross the memory cells that are not diagramed.

The aluminum layers 24a, 24b that serve as data lines $D_1, D_2$ are formed to be shorter than the data lines $\overline{D_1}, \overline{D_2}$ so that their ends are overlapped on only portions of the source regions 11a, 12b of MISFET's $Q_{p1}, Q_{p2}$. Like the data lines $\overline{D_1}, \overline{D_2}$, the data lines $D_1, D_2$ are formed by the first aluminum layers, and are contacted to buffer polycrystalline silicon layers 14b, 15b through contact hole 23b.

A buffer layer 25 consisting of an aluminum layer is continuously formed on the common drain regions 13a, 13b between the polycrystalline silicon gate electrode layers 20a, 20b and is contacted to the lower buffer polycrystalline silicon layers 16a, 16b via contact hole 23c. The buffer layer 25 is further contacted to the gate electrode layer 20c via contact hole 28.

A power source line 26 consisting of a second aluminum layer is formed on the aluminum layers 22a, 22b, 24a, 24b via an insulating film to stretch in a direction (right and left direction in the drawing) at right angles with the data lines. The power source line 26 is impressed with the power source voltage $V_{CC}$, and is contacted to the buffer aluminum layer 25 through contact hole 27 formed in the insulating film under the power source line 26. Therefore, the power source voltage $V_{CC}$ is applied to the gate electrode layers 20a, 20b and to common drain regions 13a, 13b of MISFET's $\overline{Q_{p1}}, Q_{p2}, \overline{Q_{p2}}$ via the aluminum layer 25 and the underlying buffer polycrystalline silicon layers 16a, 16b.

FIG. 10 shows an embodiment of layout of column switching MISFET's $Q_{y1}, \overline{Q_{y1}}, Q_{y2}, \overline{Q_{y2}}$ on two pairs of complementary data lines.

Even in this portion, the two rectangular active regions 30a, 30b of which the peripheries are isolated by a selectively oxidized film are vertically arranged on the semiconductor substrate along the direction of data lines. On the active region 30a, 30b are formed, via a gate insulating film (not shown), a pair of parallel gate electrode layers 40a, 40b that consist of polycrystalline silicon layers. By implanting n-type impurities into the main surface on the semiconductor substrate with the gate electrode layers 40a, 40b as masks, there are formed source regions 31a, 32a and a common drain region 33a of column switching MISFET's $\overline{Q_{y1}}, \overline{Q_{y2}}$ of the side of data lines $\overline{D_1}, \overline{D_2}$ in the active region 30a. Similarly, in the active region 30b are formed source regions 31b, 32b and a common drain region 33b of column switching MISFET's $\overline{Q_{y1}}, \overline{Q_{y2}}$ of the side of data lines $\overline{D_1}, \overline{D_2}$.

On the source and drain regions 31a to 33a, 31b to 33b are formed, via an insulating film, polycrystalline silicon layers 34a, 35a, 36a and 24b, 35b, 36b that serve as buffer layers and that are contacted to the source and drain regions 31a to 33a, 31b to 33b via an elongated contact hole 41 which is formed in the underlying insulating film running in the direction of data lines. The polycrystalline silicon layers 34a to 36a, 34b to 36b are formed simultaneously with the polycrystalline silicon layer which forms high-resistance elements in the memory cells of the type of high-resistance load.

First aluminum layers 24a, 24b that serve as data lines $D_1, D_2$ stretch on the drain regions 31a, 32a located on the outside of the pair of gate electrode layers 40a, 40b, and are contacted to the buffer polycrystalline silicon layers 34a, 35a through contact hole 43a. The aluminum layers 22a, 22b that serve as data lines $D_1, D_2$ intersect the gate electrodes 40a, 40b at the center of the active region 30a passing between the gate electrode layers 40a and 40b and stretch onto the drain regions 31b, 32b on the active region 30b passing through the outside, and are contacted to the buffer polycrystalline silicon layers 34b, 35b through contact hole 43b.

Further, buffer layers 45a, 45b consisting of the first aluminum layers same as the data lines are formed, via an insulating film, on the buffer polycrystalline silicon layers 36a, 36b which are formed on the common source regions 33a, 33b between the gate electrode layers 40a and 40b. The buffer aluminum layers 45a, 45b are contacted to the underlying buffer polycrystalline silicon layers 36a, 36b through contact hole 43c.

On the buffer aluminum layers 45a, 45b are formed common data lines 46a, 46b (CD1, $\overline{\text{CDL}}$) consisting of second aluminum layers via an insulating film in a direction to intersect the aluminum layers 22a, 22b that serve as the data $\overline{D}_1$, $\overline{D}_2$ at right angles therewith. To the aluminum layers 46a, 46b that serve as common data lines are contacted the buffer aluminum layers 45a, 45b through contact holes 47a, 47b.

Therefore, the data lines $D_1$, $D_2$ (24a, 24b) are connected to the common data line CDL (46a) via column switching MISFET's $Q_{y1}$, $Q_{y2}$ and buffer layers 36a, 45a. The data lines $\overline{D}_1$, $\overline{D}_2$ (22a, 22b) are connected to the common data line $\overline{\text{CDL}}$ (46b) via column switching MISFET's $Q_{y1}$, $Q_{y2}$ and buffer layers 36b, 45b.

According to the above-mentioned embodiment, two polycrystalline silicon layers and two aluminum layers are formed through the manufacturing process, the first aluminum layer constituting the complementary data lines D, $\overline{D}$, and the second aluminum layer co common data lines CDL, $\overline{\text{CDL}}$ and the power source wiring $V_{CC}$. Therefore, MISFET's $Q_p$ and $\overline{Q_p}$ are formed having the same structure and the same shape, and MISFET's $Q_y$ and $\overline{Q_y}$ are also formed having the same structure and the same shape.

Prior to accomplishing the present invention, the inventors had formed MISFET's $Q_p$, $\overline{Q_p}$ and $Q_y$, $\overline{Q_y}$ relying upon two polycrystalline silicon wiring layers and one aluminum wiring layer. With this method, however, the complementary data lines D, $\overline{D}$, common data lines CDL, $\overline{\text{CDL}}$, and the wiring $V_{CC}$ had to be formed using a single aluminum layer. Therefore, it was difficult to form the MISFET's $Q_p$, $\overline{Q_p}$ and $Q_y$, $\overline{Q_y}$ maintaining the same shape. Since they could not be formed maintaining the same shape, differences existed in the parasitic resistances of MISFET's $Q_p$, $\overline{Q_p}$. Therefore, the same characteristics could not be obtained, and offset developed on the complementary data lines D, $\overline{D}$. Parasitic resistances of the MISFET's $Q_p$, $\overline{Q_p}$ can be equalized by adding resistance of polycrystalline silicon or by additionally implanting impurity ions. However, addition of resistance of polycrystalline silicon is liable to invite variation in the resistance due to insufficient precision for setting the resistance of polycrystalline silicon and deviation of masks. Additional implantation of ions, on the other hand, requires an increase in the number of processing steps, which makes it difficult to produce semiconductor memory devices at reduced costs. Therefore, none of these methods are advantageous to form the MISFET's $Q_p$, $\overline{Q_p}$ and $Q_y$, $\overline{Q_y}$ that exhibit the same characteristics.

By forming the MISFET's $Q_{p1}$, $\overline{Q_{p1}}$ maintaining the same shape (same layout), however, the same characteristics are exhibited by these elements, whereby imbalance (offset voltage) of precharging voltages for the complementary data lines $D_1$, $\overline{D}_1$ is eliminated, the voltage amplitude of common data lines CDL, $\overline{\text{CDL}}$ is reduced (about 30 mV) at the time of reading the data, and a sufficiently large operation margin is obtained even when the operation is carried out at high speeds.

Furthermore, the MISFET's $Q_{y1}$, $\overline{Q_{y1}}$ formed maintaining the same shape exhibit the same characteristics, and exhibit the same resistance Ron when they are conductive. Therefore, the voltage amplitude of the common data lines CDL, $\overline{\text{CDL}}$ is in phase with the voltage amplitude of the complementary data lines D, $\overline{D}$, and the data is not erroneously read out.

Therefore, variance in the element characteristics that stems from the shapes (layouts) of elements can be reduced. Attention, however, must also be given to variance in the element characteristics that stems from variance in the manufacturing process.

In this embodiment, the MISFET's used in the peripheral circuits have a gate length L of 2 μm which is a minimum processable size. With the MISFET's $Q_p$, $\overline{Q_p}$, $Q_y$, $\overline{Q_y}$ having the gate length L or 2 μm, however, the process will undergo variation δ to an increased degree. Therefore, the MISFET's $Q_{p1}$, $\overline{Q_{p1}}$ and $Q_{y1}$, $\overline{Q_{y1}}$ are formed to have a gate length L that is longer than the minimum processable size within a range allowed by the pitch of data lines, such that variation δ of the process is decreased and that variance in the characteristics of the MISFET's $Q_{y1}$, $\overline{Q_{y1}}$ and $Q_{p1}$, $\overline{Q_{p1}}$ is decreased. In this embodiment, the elements $Q_{p1}$, $Q_{p1}$ have a gate length L of, for example, 2.5 μm and the elements $Q_{y1}$, $Q_{y1}$ have a gate length L of 2.2 μm.

As described above, the gate length L of MISFET's $Q_{p1}$, $\overline{Q_{p1}}$ is selected to be larger than the minimum processable size, in order to reduce variance in the production. Therefore, the MISFET's $Q_{p1}$, $\overline{Q_{p1}}$ exhibit the same characteristics, and there exists no imbalance (offset voltage) of precharging voltages for the complementary data lines $D_1$, $\overline{D}_1$, and a sufficiently large margin is obtained even when the voltage amplitude of the complementary data lines $D_1$, $\overline{D}_1$ is decreased at the time of reading the data in order to increase the operation speed.

Moreover, since the gate length L of the elements $Q_{y1}$ and $\overline{Q_{y1}}$ is selected to be greater than processable size to decrease variance in the production, the elements $Q_{y1}$, $\overline{Q_{y1}}$ exhibit the same characteristics and the same resistance Ron when they are conductive. Therefore, the voltage amplitude of the common data lines CDL, $\overline{\text{CDL}}$ becomes in phase with the voltage amplitude of the complementary data lines $D_1$, $\overline{D}_1$, and the data is not erroneously read out.

If the gate length L is simply increased, however, the transconductance $g_m$ of the MISFET's becomes small. Therefore, the gate width W should be increased correspondingly, so that the transconductance $g_m$ increases. In the above-mentioned embodiment, the gate width W of MISFET's $Q_{p1}$, $\overline{Q_{p1}}$ is selected to be 20 μm, and the gate width W of MISFET's $Q_{y1}$, $\overline{Q_{y1}}$ is selected to be 23 μm, in order to increase the transconductance $g_m$.

In the above-mentioned embodiment, the MISFET's $Q_{p1}$, $\overline{Q_{p1}}$ and $Q_{y1}$, $\overline{Q_{y1}}$ are formed to have the same structure and the same shape. As the capacity of the memory increases, however, the MISFET's $Q_{p1}$, $\overline{Q_{p1}}$ and $Q_{y1}$, $\overline{Q_{y1}}$ are formed in a small size and are arranged in the vertical direction. Therefore, it becomes difficult to bring the aluminum layers 22a, 22b (or 24a, 24b) which are data lines into contact with the whole source regions 11b, 12b or 31a, 32b of MISFET's $Q_{p1}$, $\overline{Q_{p2}}$ and $Q_{y1}$, $\overline{Q_{y2}}$. Accordingly, contact resistance relative to the source region becomes out of balance between the side of data line $D_1$ and the side of data line $\overline{D}_1$, making it difficult to obtain the same element characteristics.

Figure 11A:
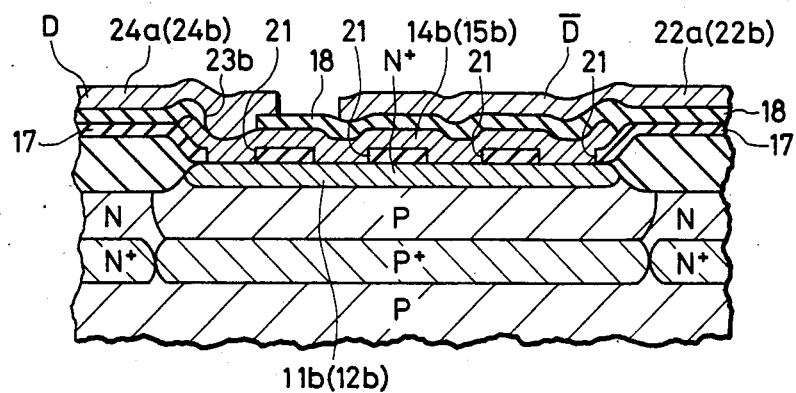
Figure 11B:
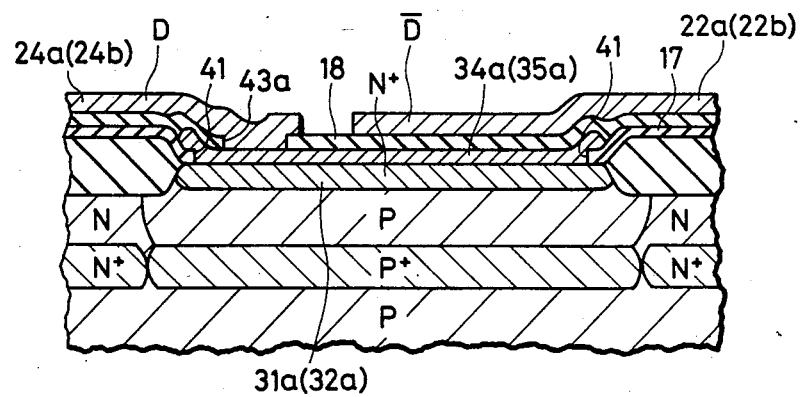

In the above embodiment, therefore, electrically conductive polycrystalline silicon layers 14b(15b), 34a(35b) having a small resistance are provided between the data line and the source (drain) region of MISFET in order to decrease the contact resistance, as shown in a section view of FIGS. 11(A) or 11(B).

FIG. 11(A) is a section view along the line XI(A)-XI(A)' of FIG. 9, and FIG. 11(B) is a section view along the line XI(B)-XI(B)' of FIG. 10.

As shown in FIGS. 11(A) and 11(B), electrically conductive buffer polycrystalline silicon layers 14a, 15b and 34a, 35b are formed between the source regions 11b, 12b, 31a, 32b of MISFET's $Q_{p1}$, $Q_{p2}$, $Q_{y1}$, $Q_{y2}$ and the aluminum layers 22, 24 formed thereon. The polycrystalline silicon layers 14b, 15b, 34a, 35a are brought into contact with source regions 11b, 12b, 31a, 32a via a plurality of contact holes or an elongated contact hole 21 formed in the insulating film 17 in the direction of data lines. To the polycrystalline silicon layers 14b, 15b and 34a, 35a are contacted aluminum layers 22a, 22b or 24a, 24b via contact holes 23b, 43a that are formed in an insulating film 18.

This enables the substantial contact areas of data lines to be sufficiently maintained for the source regions 11b, 12b and 31a, 32a, and the MISFET's are prevented from losing characteristics or developing variance in the characteristics, that may result from contact resistance and diffusion resistance.

The electrically conductive buffer polycrystalline silicon layer is formed simultaneously with the polycrystalline silicon layer that constitutes high-resistance elements in the memory cells of the type of high-resistance load which are not shown. N-type impurities are introduced into the electrically conductive buffer polycrystalline silicon layer in order to reduce the electric resistance except those portions that form resistors. Therefore, the electrically conductive polycrystalline silicon layer can be formed without requiring any additional processing steps.

In order to maintain balance between the side of the data line $D_1$ and the side of the data line $\bar{D}_1$, furthermore, aluminum layers that are data lines are brought into contact with the source regions 11a, 12a, 31b, 32b of MISFET's $Q_{p1}$, $\bar{Q}_{p2}$, $q_{y1}$, $Q_{y2}$, via buffer polycrystalline silicon layers 14a, 15a, 34b, 35b. Similarly, buffer aluminum layers 25 and 45a, 45b are brought into contact with common drains 13a, 13b and 33a, 33b via buffer polycrystalline silicon layers 16a, 16b and 36a, 36b, the buffer aluminum layers 25, 45a, 45b being connected to the $V_{CC}$ line 26 which consists of a second aluminum layer or to the common data lines 46a, 46b.

Even if the data lines are not contacted to the whole source (drain) electrodes because of MISFET's $Q_{p1}$, $\overline{Q_{p1}, Q_{y1}, \bar{Q}_{y1}}$ that are formed in a reduced size, the aforementioned contact system makes it possible to reduce the contact resistance for the electrodes of MISFET's. Therefore, the element characteristics are not deteriorated and the characteristics are not varied even when the elements are formed in a small size. This makes it possible to further reduce the offset voltage that results from imbalance of voltages between the pair of complementary data lines.

Effects of the invention will be described below.

(1) Column switching MISFET's and pull-up MISFET's on the complementary data lines are formed to have nearly the same structure and the same shape being arranged in the direction of data lines. Therefore, a decrease is obtained regarding the imbalance of characteristics that results from the shape difference of the elements. Accordingly, imbalance of voltages decreases between the pair of complementary data lines, the offset voltage for the data line decreases, and the operation margin increases.

(2) Column switching MISFET's and pull-up MISFET's on the complementary data lines have gates that are longer than the gates of other elements within a range permitted by the pitch of data lines. Therefore, element characteristics are little affected by variance in the manufacture. Namely, imbalance of voltages between the complementary data lines decreases, the offset voltage for the data lines decreases, and the operation margin increases.

(3) The complementary data lines are brought into contact with the source regions of the corresponding column switching and pull-up MISFET's via buffer polycrystalline silicon layer, so that the contact areas substantially increase between the data lines and the source regions. Since contact resistance and diffusion resistance decrease, the MISFET characteristics are not deteriorated and variance in the characteristics decreases. This makes it possible to decrease imbalance of voltage between the complementary data lines, to decrease offset voltage for the data lines, and to increase the operation margin.

In the foregoing was concretely mentioned the invention accomplished by the inventors. It should, however, be noted that the invention is in no way limited to the above-mentioned embodiment only but can be modified in a variety of other ways without departing from the spirit and scope of the invention. In the above embodiment, for instance, the polycrystalline silicon layers and aluminum layers are formed each in two layers. According to the present invention, however, these layers may be formed in three or more layers.

We claim:

1. A semiconductor memory device comprising:
   (a) a plurality of memory cells which store information therein;
   (b) a plurality of word lines and a plurality of pairs of complementary data lines coupled to said plurality of memory cells so that each memory cell is coupled to a word line and a pair of complementary data lines, ends on one side of said plurality of pairs of complementary data lines being connected to a power source voltage; and
   (c) a sense circuit which is connected to the ends on the other side of said plurality of pairs of complementary data lines, and which reads information stored in each of the memory cells;
   wherein said pairs of complementary data lines have equivalent series resistances that are equal to each other between the ends on one side connected to said power source voltage and the ends on the other side connected to said sense circuit.

2. A semiconductor memory device according to claim 1, wherein said equivalent series resistance is comprised of equivalent resistances of a plurality of elements that are present in series between the power source potential for said pairs of complementary data lines and said sense circuit.

3. A semiconductor memory device according to claim 1, wherein the equivalent series resistances of said pairs of complementary data lines are equalized by setting equal the parity of pairs of elements that are interposed in series in said pairs of complementary data lines.

4. A semiconductor memory device according to claim 1, wherein the equivalent series resistances of said pairs of complementary data lines are equalized by so forming pairs of elements as to have the same size, said pairs of elements being interposed in series in said pairs of complementary data lines.

5. A semiconductor memory device according to claim 1, wherein the equivalent series resistances of said pairs of complementary data lines are equalized by arranging contacts for each of the pairs of elements that are interposed in series in said complementary data lines so that the direction of current flow and the length of the current path are substantially the same for each element of the pairs of elements.

6. A semiconductor memory device according to claim 1, wherein said sense circuit is constituted by a differential pair of bipolar transistors.

7. A semiconductor memory device according to claim 1, wherein the equivalent series resistances of said pairs of complementary data lines comprise equivalent resistances of pull-up MISFET's arranged between the memory cells and the power source voltage that precharge said pairs of complementary data lines and equivalent resistances of switching MISFET's arranged between the memory cells and the sense circuit that transmit the data of memory cells read onto said pairs of complementary data lines to said sense circuit.

8. A semiconductor memory device according to claim 1, wherein said plurality of word lines are driven by word line drivers of which the output stage is comprised of bipolar elements to electrically charge the load capacities thereof at high speeds.

9. A semiconductor memory device according to claim 8, wherein said plurality of memory cells is comprised of MISFET's.

10. A semiconductor memory device according to claim 7, wherein said pull-up MISFET's and said switching MISFET's have gate lengths greater than 2.0 $\mu$m.

11. A semiconductor memory device according to claim 5, wherein said complementary data lines contact said elements through a buffer polycrystalline silicon layer.

12. A semiconductor memory device according to claim 11, wherein the buffer polycrystalline silicon layer has a resistance of substantially 50 ohms/□.

* * * * *